(12) United States Patent
Derderian et al.

(10) Patent No.: US 6,896,730 B2
(45) Date of Patent: May 24, 2005

(54) ATOMIC LAYER DEPOSITION APPARATUS AND METHODS

(75) Inventors: Garo J. Derderian, Boise, ID (US); Cem Basceri, Boise, ID (US); Gurtej S. Sandhu, Boise, ID (US); Demetrius Sarigiannis, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 370 days.

(21) Appl. No.: 10/163,689

(22) Filed: Jun. 5, 2002

(65) Prior Publication Data

US 2003/0226500 A1 Dec. 11, 2003

(51) Int. Cl.⁷ .................. C30B 25/00; C30B 25/14; C30B 25/16
(52) U.S. Cl. .................. 117/89; 117/84; 117/88; 117/93; 117/102; 118/715; 427/248.1; 427/255.23
(58) Field of Search .................. 117/84, 88, 93, 117/102, 89; 118/715; 427/248.1, 255.23

(56) References Cited

U.S. PATENT DOCUMENTS

| | | | |
|---|---|---|---|
| 4,036,170 A | 7/1977 | Goodheim | |
| 4,263,091 A | 4/1981 | King | |
| 4,296,920 A | 10/1981 | Miller et al. | |
| 4,689,094 A | 8/1987 | Van Rees et al. | |
| 4,761,269 A | 8/1988 | Conger et al. | |
| 4,989,637 A | 2/1991 | Dittrich | |
| 5,046,925 A | 9/1991 | Fletcher | |
| 5,200,388 A | 4/1993 | Abe et al. | |
| 5,254,210 A | 10/1993 | Jones et al. | |
| 5,316,579 A | 5/1994 | McMillan et al. | |
| 5,463,978 A | * 11/1995 | Larkin et al. .................. | 117/89 |
| 5,517,854 A | 5/1996 | Plumb et al. | |
| 5,620,524 A | 4/1997 | Fan et al. | |
| 5,730,801 A | 3/1998 | Tepman et al. | |
| 5,765,585 A | 6/1998 | Peterson | |
| 5,873,177 A | 2/1999 | Honda et al. | |
| 5,879,461 A | 3/1999 | Adams | |
| 6,079,867 A | 6/2000 | Fiorentini et al. | |
| 6,143,659 A | * 11/2000 | Leem .................. | 438/688 |
| 6,185,839 B1 | 2/2001 | Kholodenko et al. .......... | 34/255 |
| 6,200,387 B1 | 3/2001 | Ni | |
| 6,230,501 B1 | 5/2001 | Bailey, Sr. et al. | |
| 6,240,943 B1 | 6/2001 | Smith | |
| 6,245,151 B1 | 6/2001 | Bhandari et al. .............. | 34/255 |
| 6,355,561 B1 | 3/2002 | Sandhu et al. .............. | 438/676 |
| 6,403,156 B2 | 6/2002 | Jang et al. .............. | 427/255.34 |
| 6,419,462 B1 | 7/2002 | Horie et al. | |
| 6,420,230 B1 | 7/2002 | Derderian et al. .......... | 438/255 |
| 6,426,307 B2 | 7/2002 | Lim .................. | 438/778 |
| 6,458,416 B1 | 10/2002 | Derderian et al. .......... | 427/301 |
| 6,468,924 B2 | 10/2002 | Lee et al. .................. | 438/763 |
| 6,478,872 B1 | * 11/2002 | Chae et al. .................. | 117/88 |
| 6,482,262 B1 | 11/2002 | Elers et al. .................. | 117/84 |
| 6,520,936 B1 | 2/2003 | Mann | |
| 6,534,357 B1 | 3/2003 | Basceri et al. .............. | 438/239 |
| 6,541,353 B1 | 4/2003 | Sandhu et al. .............. | 438/478 |
| 6,559,472 B2 | 5/2003 | Sandhu et al. .................. | 257/31 |

(Continued)

OTHER PUBLICATIONS

U.S. patent applicatioin Ser. No. 10/340,098, Mardian et al., filed Jan. 10, 2003.

*Primary Examiner*—Nadine G. Norton
*Assistant Examiner*—Matthew Song
(74) *Attorney, Agent, or Firm*—Wells St. John P.S.

(57) ABSTRACT

An atomic layer deposition method includes positioning a semiconductor substrate within an atomic layer deposition chamber. A fixed volume first precursor gas charge is provided within a gas flow path to the deposition chamber. A fixed volume purge gas charge is provided within the gas flow path serially upstream of the first precursor gas charge. The first precursor gas charge and the purge gas charge are serially flowed along the gas flow path to the substrate within the deposition chamber effective to form a monolayer on the substrate and purge at least some of the first precursor gas from the substrate. Apparatus are also disclosed.

26 Claims, 4 Drawing Sheets

U.S. PATENT DOCUMENTS

| | | | |
|---|---|---|---|
| 6,596,583 B2 | 7/2003 | Agarwal et al. | 438/255 |
| 6,596,636 B2 | 7/2003 | Sandhu et al. | 438/676 |
| 6,613,587 B1 | 9/2003 | Carpenter et al. | 438/4 |
| 6,620,253 B1 | 9/2003 | Dando et al. | 118/728 |
| 6,627,260 B2 | 9/2003 | Derderian et al. | 427/301 |
| 6,653,154 B2 | 11/2003 | Doan et al. | 438/3 |
| 6,689,624 B2 | 2/2004 | Doan et al. | 438/3 |
| 6,730,367 B2 | 5/2004 | Sandhu | 427/553 |
| 6,743,736 B2 | 6/2004 | Mardian et al. | 438/758 |
| 6,746,934 B2 | 6/2004 | Sandhu et al. | 438/428 |
| 6,753,618 B2 | 6/2004 | Basceri et al. | 257/915 |
| 6,765,250 B2 | 7/2004 | Doan et al. | 257/295 |
| 6,787,185 B2 | 9/2004 | Derderian et al. | 427/255.25 |
| 6,787,373 B2 | 9/2004 | Dando et al. | 438/4 |
| 6,787,463 B2 | 9/2004 | Mardian et al. | 438/680 |
| 2001/0024387 A1 | 9/2001 | Raaijmakers et al. | 365/200 |
| 2001/0041250 A1 | 11/2001 | Werkhoven et al. | 428/212 |
| 2002/0037630 A1 | 3/2002 | Agarwal et al. | 438/430 |
| 2002/0192369 A1 | 12/2002 | Morimoto et al. | |
| 2003/0001190 A1 | 1/2003 | Basceri et al. | 257/306 |
| 2003/0003697 A1 | 1/2003 | Agarwal et al. | 438/496 |
| 2003/0207593 A1 | 11/2003 | Derderian et al. | 438/778 |
| 2004/0040502 A1 | 3/2004 | Basceri et al. | 118/715 |
| 2004/0040503 A1 | 3/2004 | Basceri et al. | 118/715 |

* cited by examiner

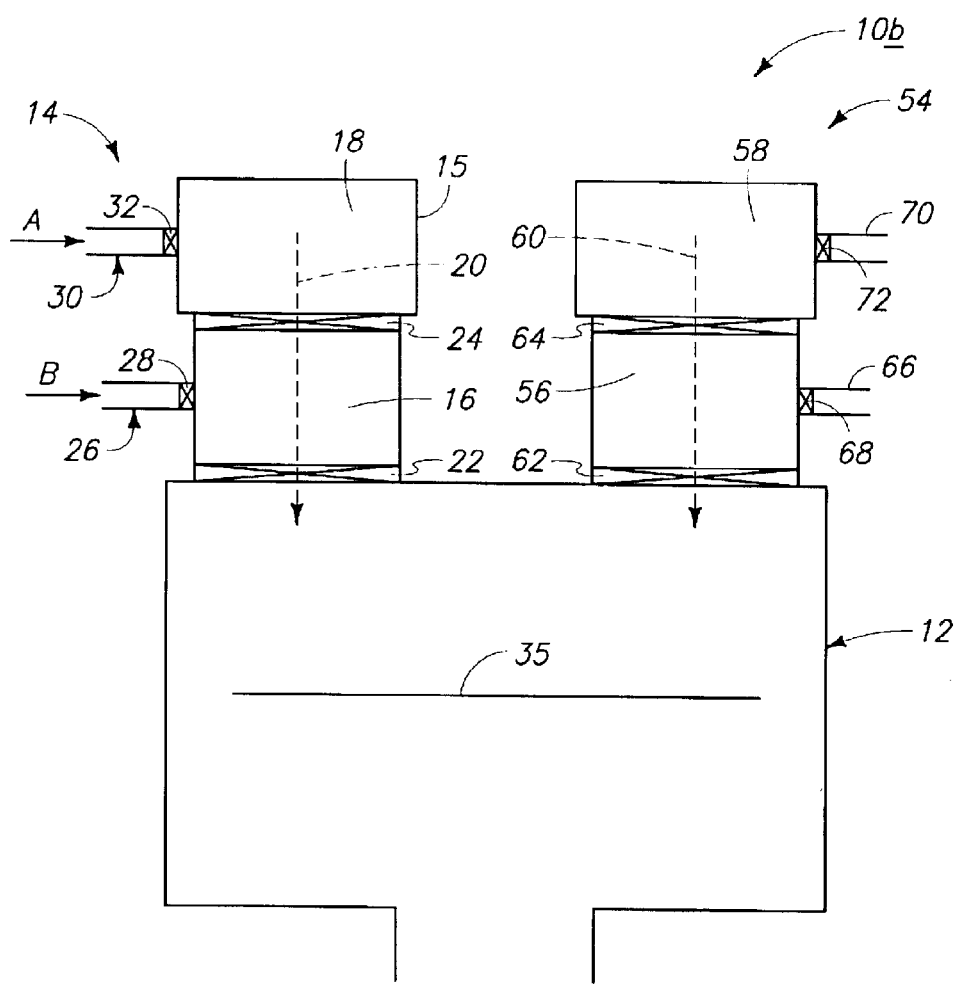

though it is expected to result in significant increase in
ATOMIC LAYER DEPOSITION APPARATUS AND METHODS

TECHNICAL FIELD

This invention relates to atomic layer deposition apparatus and methods.

BACKGROUND OF THE INVENTION

Atomic layer deposition involves the deposition of successive monolayers over a substrate within a deposition chamber typically maintained at subatmospheric pressure. An exemplary such method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

The individual precursor and inert gas flows in a production capable process are expected to be very short, for example perhaps no greater than one second. Accordingly, it is desirable that the start and stop times for the respective gas flows from zero flow to desired stabilized flow to zero flow etc. be very sharp and precisely controlled. Further, it is desirable that the stabilized flow for each successive gas start and be achieved very quickly at the termination of the previous gas flow. For example, FIG. 1 depicts a graph of flow versus time for an atomic layer deposition involving a precursor one (P1) flow, followed by an inert gas (IN) flow, followed by a precursor two (P2) flow, followed another inert gas (IN) flow. However, typical present state-of-the-art, as shown in FIG. 2, results in either one or both of the starting and stopping of the respective gas flows prior to achieving steady state not being as sharp and precise as that in FIG. 1. This is expected to result in significant increase in time for the ultimate deposition of a desired layer to occur. Accordingly, it would be desirable to develop atomic layer deposition methods and apparatus which improve upon the FIG. 2 depicted background art processing, and towards achieving more precise gas pulses in the starting and stopping thereof.

While the invention was motivated in addressing the above issues and improving upon the above-described drawbacks, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes atomic layer deposition methods and apparatus. In one implementation, an atomic layer deposition method includes positioning a semiconductor substrate within an atomic layer deposition chamber. A fixed volume first precursor gas charge is provided within a gas flow path to the deposition chamber. A fixed volume purge gas charge is provided within the gas flow path, serially upstream of the first precursor gas charge. The first precursor gas charge and the purge gas charge are serially flowed along the gas flow path to the substrate within the deposition chamber effective to form a monolayer on the substrate and purge at least some of the first precursor gas from the substrate.

In one implementation, an atomic layer deposition apparatus includes a deposition chamber. A gas feed manifold assembly is in fluid communication with the deposition chamber. A plurality of serially arranged gas chambers is in serial fluid communication with the deposition chamber along a gas flow path which includes the gas chambers. At least one respective valve separates adjacent of the gas chambers. At least one respective gas inlet is in fluid communication with the respective gas chambers.

Other aspects and implementations are contemplated.

BRIEF DESCRIPTION OF THE DRAWINGS

Preferred embodiments of the invention are described below with reference to the following accompanying drawings.

FIG. 5 is a diagrammatic depiction of still another atomic layer deposition apparatus in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
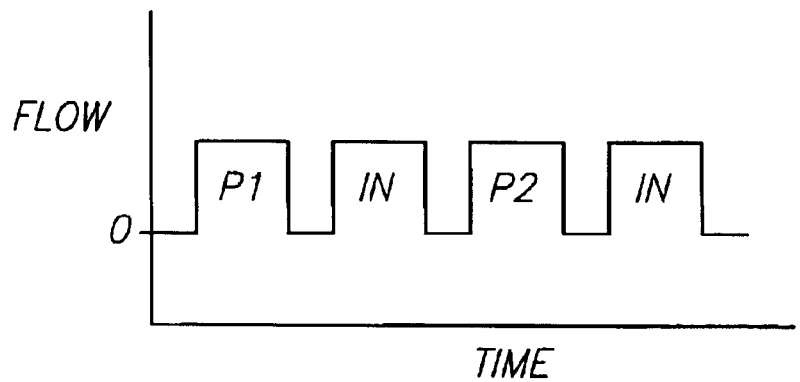
FIG. 1 is a diagrammatic depiction of flow versus time of one atomic layer deposition process.
Figure 2:
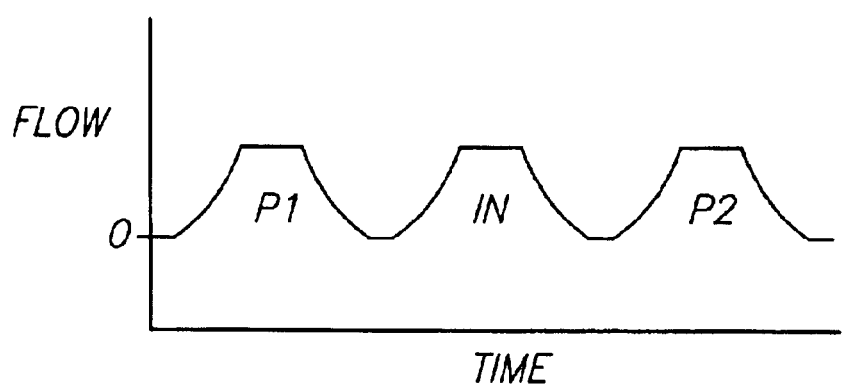
FIG. 2 is a diagrammatic depiction of flow versus time of another atomic layer deposition process.
Figure 3:
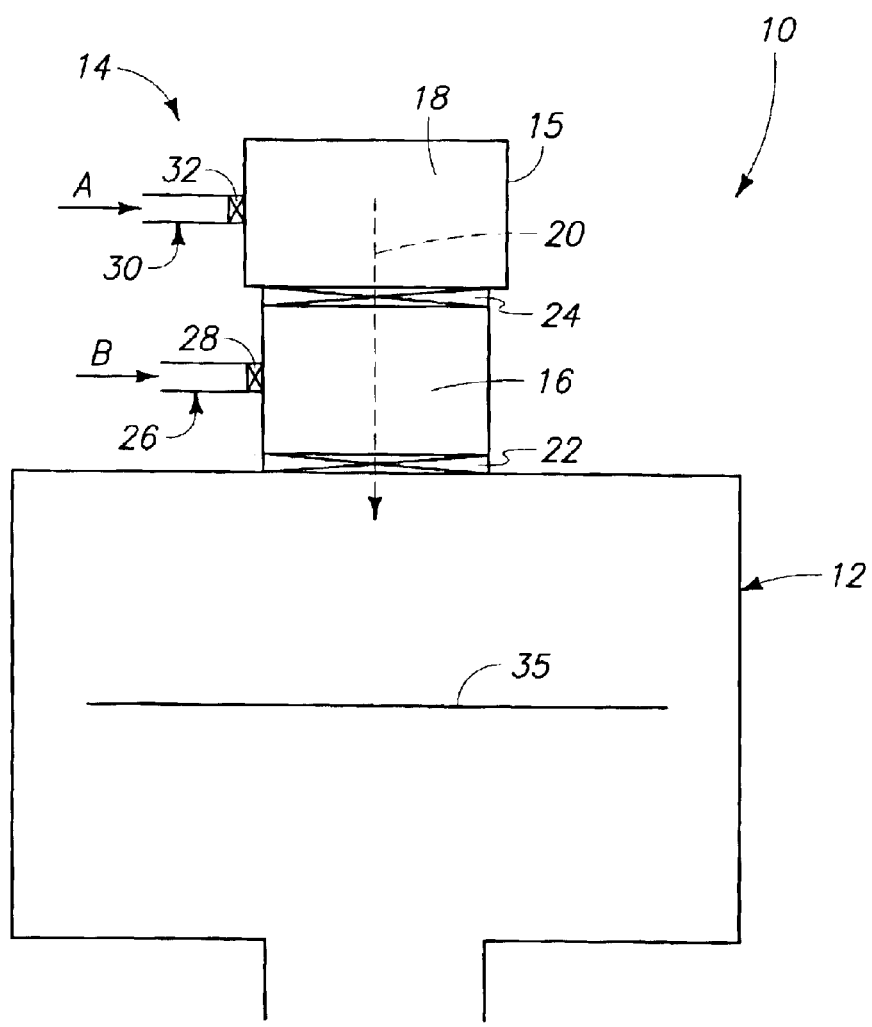
FIG. 3 is a depiction of an atomic layer deposition apparatus in accordance with one aspect of the invention.

A first embodiment atomic layer deposition apparatus in accordance with the invention is indicated generally with reference numeral 10 in FIG. 3. Such comprises a deposition chamber 12 and a gas feed manifold assembly 14 in fluid communication therewith. Assembly 14 might be considered as comprising a body 15 which includes a plurality of serially arranged gas chambers 16 and 18 which are in serial fluid communication with deposition chamber 12 along a gas flow path 20 which includes gas chambers 16 and 18. Accordingly, gas chamber 16 is proximate deposition chamber 12, with gas chamber 18 being adjacent gas chamber 16 within or relative to gas flow path 20. In the depicted preferred embodiment, gas flow path 20 through gas chambers 16 and 18 to deposition chamber 12 is along a straight line. Further in a preferred embodiment as shown, gas chambers 16 and 18 are depicted as being of respective fixed volumes. Alternately but less preferred, at least one of the serially arranged gas chambers could be of variable volume. By way of example only, variable volume chambers are described in our co-pending U.S. patent application Ser. No. 10/121,341 filed on Apr. 11, 2002, entitled "Reactive Gaseous Deposition Precursor Feed Apparatus and Chemical Vapor Deposition Method", naming Allen P Mardian and Gurtej S. Sandhu as inventors, and which is incorporated herein by reference. By way of example only, an exemplary variable volume gas chamber might include bellows walls or expandable walls.

In one preferred embodiment, the respective fixed volumes of the serially arranged chambers might be equal in amount or different in amount. The FIG. 3 embodiment depicts the volume of chamber 18 as being greater than the volume of chamber 16.

A first isolation valve 22 is shown as being operably positioned to isolate first gas chamber 16 from deposition chamber 12. A second isolation valve 24 is shown as being operably positioned to isolate first gas chamber 16 from second gas chamber 18. Valve 24 provides but one example of providing at least one respective valve which separates adjacent of a plurality of gas chambers, here gas chambers 16 and 18.

At least one respective gas inlet is provided in fluid communication with the respective gas chambers. In the FIG. 3 depicted embodiment, a first gas inlet 26 is shown in fluid communication with first gas chamber 16, with a third isolation valve being operably positioned to isolate first gas inlet 26 from first gas chamber 16. Further, a second gas inlet 30 is shown in fluid communication with second gas chamber 18, with a fourth isolation valve 32 being operably positioned to isolate second gas inlet 30 from second gas chamber 18. The FIG. 3 depicted embodiment shows only one gas inlet being associated with each gas chamber, although multiple inlets could of course be associated with one or more of the gas chambers. The depicted respective gas inlets, at least proximate where they join with their respective gas chambers, are shown extending along respective gas flow paths A and B which are parallel to one another and perpendicular relative to straight line gas flow path 20.

Figure 4:
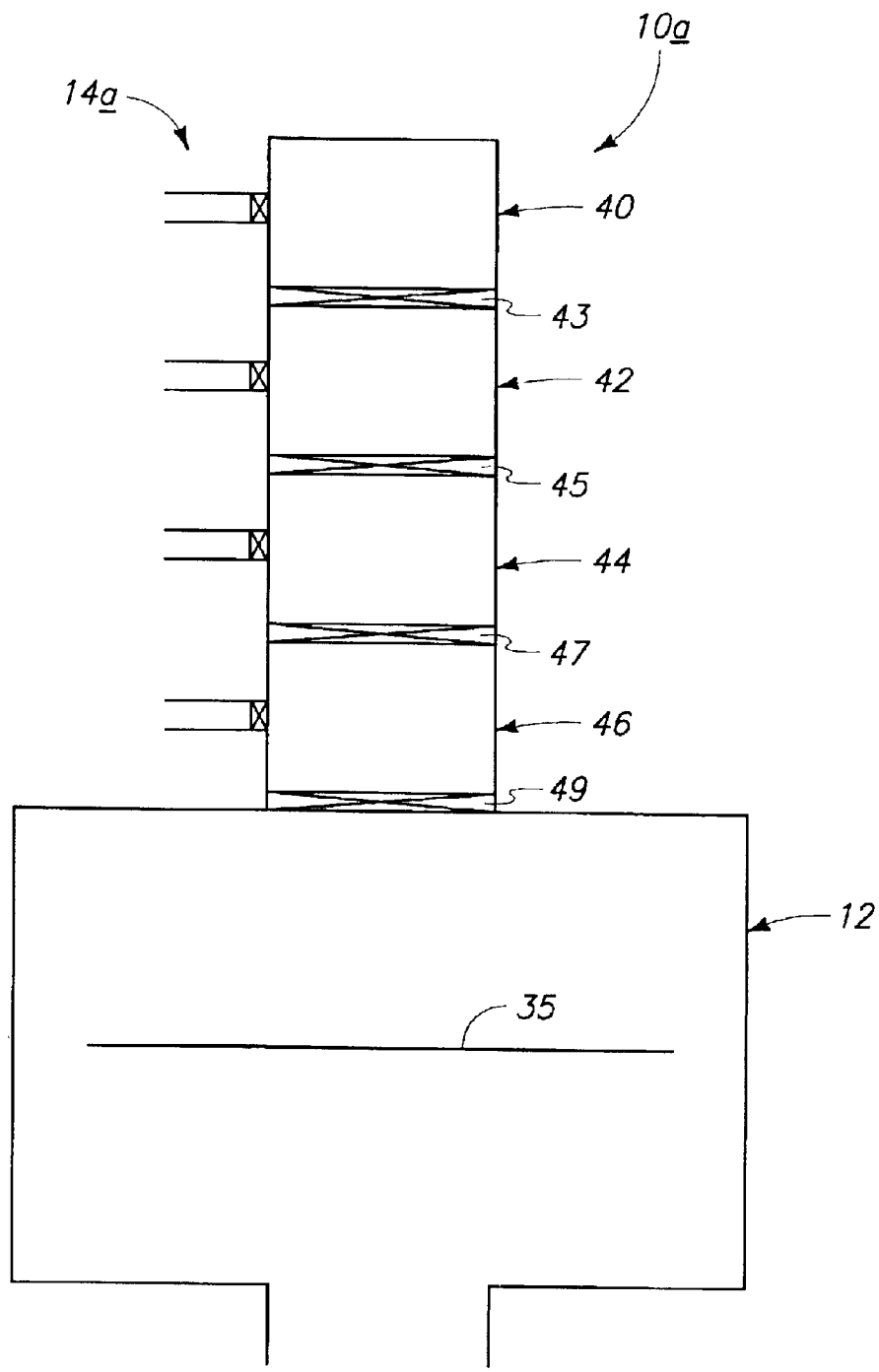
FIG. 4 is a diagrammatic depiction of another atomic layer deposition apparatus in accordance with an aspect of the invention.

FIG. 3 diagrammatically depicts but one preferred embodiment apparatus in accordance with an aspect of the invention. By way of example only, FIGS. 4 and 5 depict alternate exemplary preferred embodiments of the apparatus, and as will be described more fully below. However, the invention also includes atomic layer deposition methods totally independent of the FIGS. 3–5 apparatus. In other words, the apparatus claims are to be in no way limited by the methodical aspects of the disclosure or claims, and the methodical claims are to be in no way limited by the apparatus aspects of the disclosure or claims, unless literal limiting language appears in the respective claims, and otherwise without limiting or interpretative reference to the specification or drawings.

By way of example only utilizing the FIG. 3 diagrammatic apparatus, one exemplary preferred method will next be described. In such exemplary method, a semiconductor substrate 35 is positioned within atomic layer deposition chamber 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Suitable desired temperature and/or pressure conditions within chamber 12 can be utilized and determined, of course, as will be appreciated by the artisan. First valve 22 and second valve 24 are closed at some point. Third valve 28 and fourth valve 32 are opened at some point effective to provide a first precursor charge within first chamber 16 and a first purge gas charge within second chamber 18. With such desired charges provided, third valve 28 and fourth valve 32 are closed at some point. Then, first valve 22 and second valve 23 are opened effective to serially flow the first precursor charge and the first purge gas charge to deposition chamber 12 effective to form a monolayer on the substrate and purge at least some of the first precursor gas from the substrate. Most preferably, the opening of the first and second valves occurs at the same time, meaning simultaneously.

By way of example only, in a broader considered one aspect of the invention, such provides one atomic layer deposition method comprising positioning of a semiconductor substrate within an atomic layer deposition chamber. A fixed volume precursor gas charge is provided within a gas flow path to the deposition chamber. Further, a fixed volume purge gas charge is provided within the gas flow path serially upstream of the first precursor gas charge. The first precursor gas charge and the purge gas charge are serially flowed along the gas flow path to the substrate within the deposition chamber effective to form a monolayer on the substrate and purge at least some of the first precursor gas from the substrate. As just so stated, and in accordance with but one aspect of the invention, any conceivable method is contemplated, whether using the existing or yet-to-be developed apparatus and other methodical aspects. Of course, by way of example only, additional upstream or downstream reactor and precursor gas charges or flows might be provided within the gas flow path, either serially therewith or parallel thereto.

With respect to the operation of an exemplary FIG. 3 apparatus, the above-described method illustrates one method whereby the fixed volume precursor gas charge and the fixed volume purge gas charge are in a non-contacting relationship at least immediately prior to the serial flowing, with the FIG. 3 embodiment depicting such separation from one another by a valve, (i.e., isolation valve 24). Further by way of example only with respect to the FIG. 3 embodiment, the fixed volume first precursor gas charge and the fixed volume purge gas charge can be caused to serially flow within the gas flow path at the same time by simultaneously opening valves 24 and 22, or even at least by opening valve 24 slightly after valve 22 but before all of the contents of chamber 16 have been expelled into chamber 12. Less preferred would be the opening of valve 24 prior to the opening of valve 22, which might cause appreciable intermixing of one gas with the other prior to a desired serial flowing thereof.

Further in accordance with one preferred aspect of the above-described method utilizing the exemplary FIG. 3 apparatus, the fixed volume first precursor gas charge and the fixed volume purge gas charge are each statically received within the gas flow path 20 at least immediately prior to the serially flowing. However, the invention also contemplates a fixed or established volume of first precursor gas and first purge gas serially flowing as literally claimed without being statically received within a flow path prior to such serial flowing. Further by way of example only, the first precursor gas charge fixed volume and the purge gas charge fixed volume might be of the same or different pressures.

In another considered aspect of the invention, also contemplated is the provision of a static first precursor gas charge within a gas flow path to the deposition chamber and the providing of a static purge gas charge within the gas flow path serially upstream of the first precursor gas charges independent of a fixed volume being provided. For example and by way of example only, flowing precursor or purge gas to an atomic layer deposition chamber might undergo a respective volume change prior to entering the atomic layer deposition chamber while flowing.

The above-described FIG. 3 apparatus and methodical embodiments are relative to a gas feed manifold assembly wherein the plurality of serially arranged gas chambers are two in number. By way of example only, FIG. 4 depicts an alternate embodiment atomic layer deposition apparatus 10a employing an alternate embodiment atomic layer deposition precursor feeding manifold assembly 14a. Like numerals from the first-described embodiment are utilized where appropriate, with differences being indicated with the suffix "a" or with different numerals. By way of example only, such gas feed manifold assembly 14a is shown as including four equal volume, serially arranged, gas chambers 40, 42, 44 and 46. By way of example only, isolation valves 43, 45, 47 and 49 are shown relative thereto. Each chamber is also shown as including a respective inlet and isolation valve associated therewith. By way of example only, chamber 46 could be provided with a first gaseous precursor, chamber 44 with an inert purge gas, chamber 42 with a second gaseous precursor (the same although preferably different from the first), with chamber 40 being provided with another inert purge gas (the same or different as that received in chamber 44). Upon the opening of all the respective valves 43, 45, 47 and 49, serial flowing of the respective gases occurs to provide rapidly pulsed charges of the respective gases for atomic layer deposition on a substrate received within the chamber. Of course, additional chambers could be provided in the illustrated construction, or more preferably, multiple of such devices could be provided in parallel to deposition chamber 12.

By way of example only, FIG. 5 depicts such an exemplary atomic layer deposition apparatus 10b. Like numerals from the first-described embodiment are utilized where appropriate, with differences being indicated with the suffix "b" or with different numerals. By way of example only, apparatus 10b includes atomic layer deposition precursor feeding manifold assembly 14 of FIG. 3. Another like manifold assembly 54 is associated with deposition chamber 12, also. An alternate embodiment to that of assembly 14 could also of course be utilized. In the depicted embodiment, second assembly 54 comprises two serially arranged gas chambers 56 and 58 in serial fluid communication with deposition chamber 12 along a second gas flow path 60 which includes the gas chambers of second assembly 54. Gas chamber 56 is received proximate deposition chamber 12, while gas chamber 58 is adjacent to gas chamber 56 within or relative to second gas flow path 60. A fifth isolation valve 62 is operably positioned to isolate gas chamber 56 from deposition chamber 12. A sixth isolation valve 64 is operably positioned to isolate gas chambers 56 and 58 from one another. A third gas inlet 66 is provided in fluid communication to gas chamber 56. A seventh isolation valve 68 is operably positioned to isolate third gas inlet 66 from gas chamber 56. A fourth gas inlet 70 is provided in fluid communication with gas chamber 58. An eighth isolation valve 72 is operably positioned to isolate fourth gas inlet 70 from gas chamber 58.

At some point, fifth valve 62 and sixth valve 64 are closed, and seventh valve 68 and eighth valve 72 are opened effective to provide a second precursor charge within chamber 56 and a second purge gas charge within chamber 58. At some point thereafter, seventh valve 68 and eighth valve 72 are closed. After serially flowing the first precursor and the first purge gas charge using first manifold assembly 14, at some point fifth valve 62 and sixth valve 64 are opened effective to serially flow the second precursor charge and the second purge gas charge to the deposition chamber effective to form a monolayer on the substrate and purge at least some of the second precursor gas from the substrate. Accordingly, and by way of example only, one of devices 14 or 54 can be loaded with gas charges while the other is discharging to chamber 12.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An atomic layer deposition method, comprising:
   positioning a semiconductor substrate within a deposition chamber;
   providing a fixed volume first precursor gas charge within a gas flow path to the deposition chamber;
   providing a fixed volume purge gas charge within the gas flow path serially upstream of the first precursor gas charge; and
   serially flowing the first precursor gas charge and the purge gas charge along the gas flow path to the substrate within the deposition chamber effective to form a monolayer on the substrate and purge at least some of the first precursor gas from the substrate.

2. The method of claim 1 wherein the first precursor gas charge fixed volume and the purge gas charge fixed volume are different in amount.

3. The method of claim 2 wherein the purge gas charge fixed volume is larger than the first precursor gas charge fixed volume.

4. The method of claim 1 wherein the first precursor gas charge fixed volume and the purge gas charge fixed volume are equal in amount.

5. The method of claim 1 wherein the first precursor gas charge fixed volume and the purge gas charge fixed volume are different in pressure.

6. The method of claim 1 wherein the first precursor gas charge fixed volume and the purge gas charge fixed volume are equal in pressure.

7. The method of claim 1 wherein the gas flow path from the fixed volume purge gas charge to the fixed volume first precursor gas charge to the deposition chamber is along a straight line.

8. The method of claim 1 wherein the fixed volume first precursor gas charge and the fixed volume purge gas charge are in a non-contacting relationship at least immediately prior to the serially flowing.

9. The method of claim 8 wherein the fixed volume first precursor gas charge and the fixed volume purge gas charge are separated from one another by a valve at least immediately prior to the serially flowing.

10. The method of claim 1 wherein the fixed volume first precursor gas charge and the fixed volume purge gas charge serially flow within the gas flow path at the same time.

11. The method of claim 1 wherein the fixed volume first precursor gas charge and the fixed volume purge gas charge are each statically received within the gas flow path at least immediately prior to the serially flowing.

12. An atomic layer deposition method, comprising:
   positioning a semiconductor substrate within a deposition chamber;
   providing a static first precursor gas charge within a gas flow path to the deposition chamber;
   providing a static purge gas charge within the gas flow path serially upstream of the first precursor gas charge; and
   serially flowing the first precursor gas charge and the purge gas charge along the gas flow path to the substrate within the deposition chamber effective to form a monolayer on the substrate and purge at least some of the first precursor gas from the substrate.

13. The method of claim 12 wherein the static first precursor gas charge and the static purge gas charge are different in volume amount.

14. The method of claim 13 wherein the static purge gas charge is larger than the static first precursor gas charge.

15. The method of claim 12 wherein the static first precursor gas charge and the static purge gas charge are equal in volume amount.

16. The method of claim 12 wherein the static first precursor gas charge and the static purge gas charge are different in pressure.

17. The method of claim 12 wherein the static first precursor gas charge and the static purge gas charge are equal in pressure.

18. The method of claim 12 wherein the gas flow path from the static purge gas charge to the static first precursor gas charge to the deposition chamber is along a straight line.

19. The method of claim 12 wherein the static first precursor gas charge and the static purge gas charge are separated from one another by a valve at least immediately prior to the serially flowing.

20. The method of claim 12 wherein the static first precursor gas charge and the static purge gas charge serially flow within the gas flow path at the same time.

21. An atomic layer deposition method, comprising:
   positioning a semiconductor substrate within a deposition chamber, the deposition chamber having a first gas feed manifold assembly in fluid communication therewith, the first assembly comprising at least two serially arranged gas chambers in serial fluid communication with the deposition chamber along a first gas flow path which includes the gas chambers, a first of the at least two gas chambers being proximate the deposition chamber, a second of the at least two chambers being adjacent the first gas chamber within the first gas flow path, a first isolation valve operably positioned to isolate the first gas chamber from the deposition chamber, a second isolation valve operably positioned to isolate the first gas chamber from the second gas chamber, a first gas inlet to the first gas chamber, a third isolation valve operably positioned to isolate the first gas inlet from the first gas chamber, a second gas inlet to the second gas chamber, a fourth isolation valve operably positioned to isolate the second gas inlet from the second gas chamber;
   closing the first valve, closing the second valve, opening the third valve and opening the fourth valve effective to provide a first precursor charge within the first chamber and a first purge gas charge within the second chamber;
   after providing the first precursor charge within the first chamber and the first purge gas charge within the second chamber, closing the third valve and closing the fourth valve; and
   after closing the third valve and closing the fourth valve, opening the first valve and opening the second valve effective to serially flow the first precursor charge and the first purge gas charge to the deposition chamber effective to form a monolayer on the substrate and purge at least some of the first precursor gas from the substrate.

22. The method of claim 21 wherein the openings of the first and second valves occur at the same time.

23. The method of claim 21 wherein the first gas flow path from the second chamber to the first chamber to the deposition chamber is along a straight line.

24. The method of claim 21 wherein,
   the deposition chamber has a second gas feed manifold assembly in fluid communication therewith, the second assembly comprising at least two serially arranged gas chambers in serial fluid communication with the deposition chamber along a second gas flow path which includes the gas chambers of the second assembly, one of the at least two gas chambers of the second assembly being proximate the deposition chamber, another of the at least two chambers of the second assembly being adjacent the one gas chamber within the second gas flow path, a fifth isolation valve operably positioned to isolate the one gas chamber from the deposition chamber, a sixth isolation valve operably positioned to isolate the one gas chamber from the other gas chamber, a third gas inlet to the one gas chamber, a seventh isolation valve operably positioned to isolate the third gas inlet from the one gas chamber, a fourth gas inlet to the other gas chamber, an eighth isolation valve operably positioned to isolate the fourth gas inlet from the other gas chamber;
   closing the fifth valve, closing the sixth valve, opening the seventh valve and opening the eighth valve effective to provide a second precursor charge within the one chamber and a second purge gas charge within the other chamber;
   after providing the second precursor charge within the one chamber and the second purge gas charge within the other chamber, closing the seventh valve and closing the eighth valve;
   after serially flowing the first precursor and the first purge gas, after closing the seventh valve and after closing the eighth valve, opening the fifth valve and opening the sixth valve effective to serially flow the second precursor charge and the second purge gas charge to the deposition chamber effective to form a monolayer on the substrate and purge at least some of the second precursor gas from the substrate.

25. The method of claim 24 wherein the openings of the fifth and sixth valves occur at the same time.

26. The method of claim 24 wherein the openings of the first and second valves occur at the same time.

* * * * *

UNITED STATES PATENT AND TRADEMARK OFFICE
CERTIFICATE OF CORRECTION

PATENT NO.         : 6,896,730 B2                                       Page 1 of 1
APPLICATION NO. : 10/163689
DATED              : May 24, 2005
INVENTOR(S)        : Derderian et al.

It is certified that error appears in the above-identified patent and that said Letters Patent is hereby corrected as shown below:

Col 1           #54     lines 1-2
Title Page in the Title, please delete "APPARATUS AND" after "DEPOSITION".

56           Col. 2   line 1
Title page, "References Cited", "OTHER PUBLICATIONS", please delete "applicationin" after "U.S. patent" and insert --application--.

56           Col. 2   line 2
Title page, "References Cited", "OTHER PUBLICATIONS", please insert --U.S. Patent Application Ser. No. 10/087,558, Dando et al., filed Feb. 28, 2002.-- after "filed Jan. 10, 2003.".

Signed and Sealed this

Twenty-second Day of August, 2006

JON W. DUDAS
*Director of the United States Patent and Trademark Office*